United States Patent
Yu et al.

(10) Patent No.: US 8,044,466 B2
(45) Date of Patent: Oct. 25, 2011

(54) ESD PROTECTION DEVICE IN HIGH VOLTAGE AND MANUFACTURING METHOD FOR THE SAME

(75) Inventors: Ding-Jeng Yu, Hsin Chu (TW); Tao Cheng, Hsin Chiu (TW); Chao-Chih Chiu, Hsin Chu Hsien (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/352,407

(22) Filed: Jan. 12, 2009

(65) Prior Publication Data

US 2009/0152588 A1 Jun. 18, 2009

Related U.S. Application Data

(62) Division of application No. 11/186,857, filed on Jul. 22, 2005, now Pat. No. 7,491,584.

(51) Int. Cl.
*H01L 23/62* (2006.01)
(52) U.S. Cl. .......... 257/355; 257/360; 257/E29.174
(58) Field of Classification Search .......... 257/355, 257/360, 173, E29.174
See application file for complete search history.

(56) References Cited

U.S. PATENT DOCUMENTS

| | | | |
|---|---|---|---|
| 5,181,091 A * | 1/1993 | Harrington et al. | 257/355 |
| 6,476,449 B1 | 11/2002 | Lin | |
| 6,507,090 B1 | 1/2003 | Hu et al. | |
| 6,542,346 B1 | 4/2003 | Chen et al. | |
| 6,825,504 B2 * | 11/2004 | Ishizuka et al. | 257/173 |
| 7,023,676 B2 * | 4/2006 | Ker et al. | 361/56 |
| 7,067,884 B2 * | 6/2006 | Okushima | 257/355 |
| 2004/0085691 A1 | 5/2004 | Ker et al. | |
| 2004/0155291 A1 | 8/2004 | Okushima | |
| 2005/0045955 A1 * | 3/2005 | Kim et al. | 257/355 |

* cited by examiner

*Primary Examiner* — Michael Trinh
(74) *Attorney, Agent, or Firm* — Birch, Stewart, Kolasch & Birch, LLP

(57) ABSTRACT

An ESD protection device comprises a substrate of a first conductive type; a transistor formed in the substrate having an input terminal of the first conductive type, a control terminal of a second conductive type, and a ground terminal of the first conductive type; and a diode formed in the substrate having a first terminal of the first conductive type and a second terminal of the second conductive type, wherein the input terminal and the second terminal are coupled to an input, and the ground terminal and the first terminal are coupled to a ground.

11 Claims, 11 Drawing Sheets

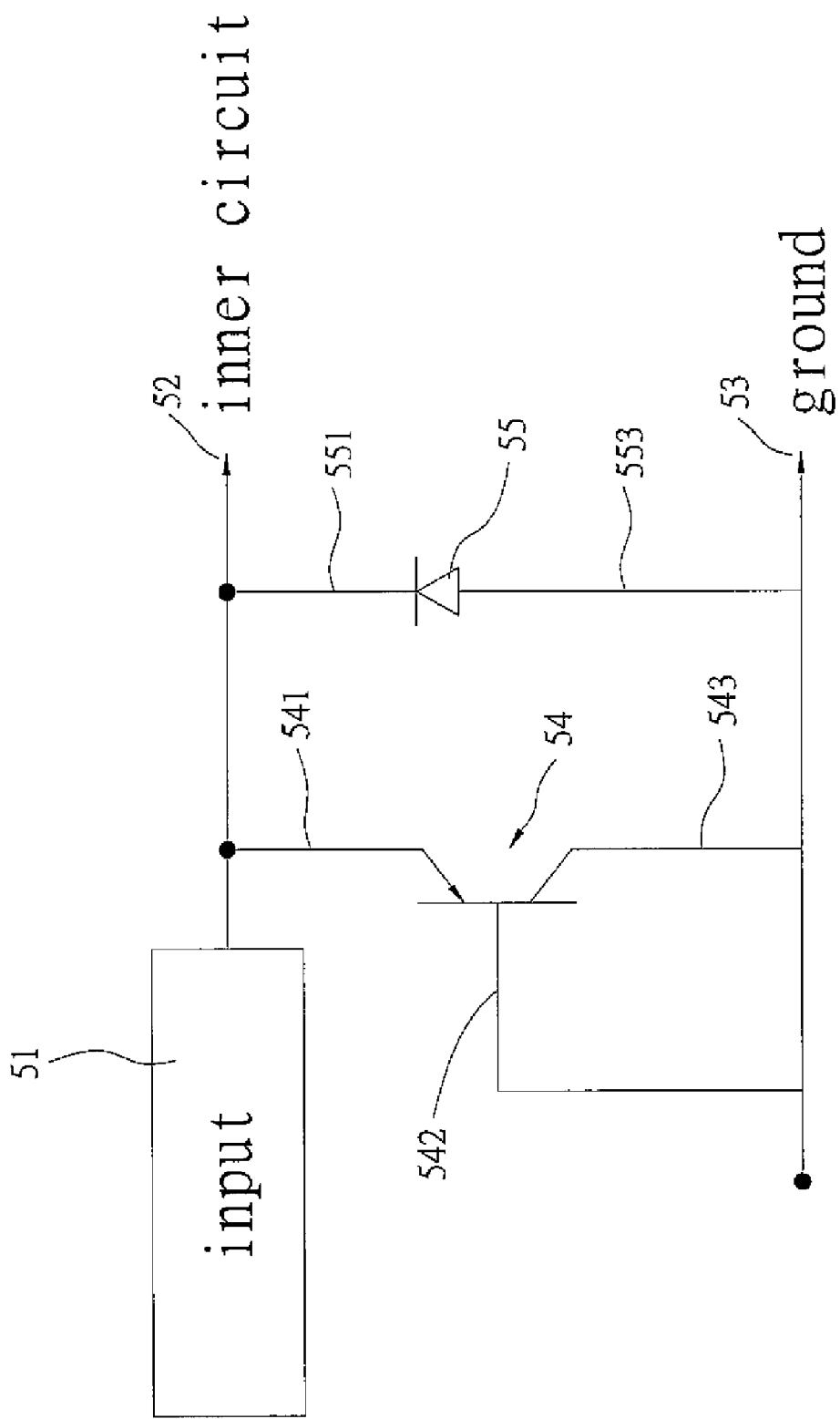

ESD PROTECTION DEVICE IN HIGH VOLTAGE AND MANUFACTURING METHOD FOR THE SAME

This application is a Divisional of U.S. patent application Ser. No. 11/186,857, filed Jul. 22, 2005 (now U.S. Pat. No. 7,491,584) and entitled "ESD PROTECTION DEVICE IN HIGH VOLTAGE AND MANUFACTURING METHOD FOR THE SAME".

BACKGROUND OF THE INVENTION

The present invention relates to an ESD protection device working in high voltage and the manufacturing method, more particularly to the ESD protection circuit, which comprises at least one PNP transistor and at least one diode coupled in parallel to enhance the ESD protection capability.

Electrostatic discharge (ESD) is the major threat to destroy an electrical element due to the electrical overstress (EOS) when the electrical element is operated. The ESD event can easily break down the electrical element and cause the semiconductor elements, computer system, etc. to be permanent damage since the elements are getting tiny and subtle. After that, the relevant product will be affected and failed.

The electrostatic charges will be accumulated in human body, electrical apparatus, or any other equipment during the electrical elements or device is under manufacturing, producing, installing, testing, storing or moving process. Generally, the electrostatic discharging is incurred from the cause of human body terminal. Afterward, the electrostatic charges will be discharged and formed an ESD discharging path while the human body terminals with the objects mentioned above or any other terminal event occurs between the elements. Then the electrical elements or devices would suffer the unexpected damage.

An ESD protection circuit or protection device is incorporated to be the discharging path provider within the integrated chip (IC) or electrical circuit generally. Since the elements used in the ESD protection circuit must have low breakdown voltage therein or faster discharging speed, the ESD protection circuit nearby should have an ESD discharging path to discharge the ESD current at an early time while the ESD event occurred in the I/O pins.

The elements used in the ESD protection circuit of the prior art includes (1) Electric resistance; (2) Diode formed with PN junction; (3) NMOS/PMOS; (4) Field-oxide device; (5) Bipolar junction transistor; (6) Silicon controlled rectifier (SCR) device (P-N-P-N structure), etc.

FIG. 1 shows the current-voltage (I-V) curve of the ESD protection element. ESD protection element is used to discharge the ESD current in a first breakdown zone 2 shown in FIG. 1. If the ESD current reaches the second breakdown zone 4, the element would incur the permanent damage. In general, an ESD protection element can tolerate a maximum ESD current Ibd, which is the current corresponding to a second breakdown point C shown in FIG. 1. When the element goes through a first breakdown point A to the second breakdown zone 4, the ESD protection device operates in a snap breakdown zone 3. Therefore, the ESD protection device will not be damaged, and even form an ESD discharging path to ground potential.

Reference is made to FIG. 2 shown an ESD protection device of the prior art. Two clamping diodes 25, 26 are installed between an input contact 21 and an inner circuit 23, and are used to be the protection devices as the ESD event occurred. When the input contact 21 received a positive ESD pulse, whose peak is higher than VDD, diode 25 will be turned on and induce current to flow to the power supply VDD rather than to the inner circuit 23. Similarly, when the input contact 21 received a negative ESD pulse, whose peak is lower than VSS, diode 26 will be turned on and induce current to flow to the power supply VSS rather than to the inner circuit 23.

U.S. Pat. No. 6,542,346 discloses an ESD protection circuit shown in FIG. 3. The ESD protection circuit is employed to couple with an input 31 and an inner circuit 33. The ESD protection circuit comprises a voltage-sharing circuit 35 and a silicon controlled rectifier (SCR) 37. The voltage-sharing circuit 35 is electrically coupled between the VSS and the input 31, and a reference voltage not higher than the voltage of the input 31 is generated thereby. The SCR 37 electrically couples with the input 31, ground and the voltage-sharing circuit 35, and is formed by the heavily concentration P-type and N-type semiconductor material on a P-type semiconductor substrate. Then the voltage-sharing circuit 35 is used to turn on a NMOS switch 36 of the SCR 37 by taking the reference of the reference voltage during the ESD discharging event. Wherein the NMOS switch 36 comprises a gate to trigger the SCR 37 to release the ESD current at input 31. Lastly the SCR 37 is to provide an ESD discharging path to protect the inner circuit 33.

A PNP transistor is to be the ESD protection element as the U.S. Pub. US2004/0085691A1 disclosed. Referring to FIG. 4, the ESD protection element comprises a P-type semiconductor substrate 40 to be the collector, a N-type well 42 is buried thereon, then the heavily concentration P-type semiconductor zones 401, 402 are doped on the substrate 40, which is used to be the terminals outside. An emitter of the ESD protection element is formed with the heavily concentration P-type semiconductor zone 403 doped within the N-type well 42. According to the structure, N-type heavily doped regions 411 and 412 are formed adjacent to the N-type well 42, and further a plurality of isolated layers 44 are formed to isolate the regions 401, 411, 403, 412 and 402. The structure stated above is equivalent to a PNP bipolar junction transistor with low breakdown voltage, and is formed the protection element. When the PN or NP junction avalanches due to the ESD discharging, the ESD discharging path is provided from the emitter formed by P-type semiconductor zone 403 to the collector formed by P-type semiconductor substrate 40 instantaneously.

Moreover, the junction between P-type semiconductor zone 403 and N-type well 42 has low breakdown voltage since the zone 403 is heavily doped. Otherwise, the junction between N-type well 42 and P-type semiconductor substrate 40 has a relatively high breakdown voltage since both the substrate 40 and the N-type well are lightly doped, and where the junction is not easily broken through by ESD current.

In view of the structure of the arts aforementioned has the capability of preventing the damage from ESD event, the present invention further provides an ESD protection device by electrically coupling diode and PNP transistor in parallel, and the strength of protection will be enhanced substantially, especially in human body mode. Specifically, the high-voltage ESD protection the present invention can meet is at least more than 4 KV.

SUMMARY OF THE DISCLOSURE

Electrostatic discharge (ESD) protection device and the manufacturing method is disclosed. The ESD protection device is installed between a ground and an input connected with an inner circuit to be protected thereby providing an ESD discharging path during the ESD event. The ESD protection device comprises a substrate of a first conductive type; a transistor formed in the substrate having an input terminal of the first conductive type, a control terminal of a second conductive type, and a ground terminal of the first conductive type; and a diode formed in the substrate having a first terminal of the first conductive type and a second terminal of the second conductive type, wherein the input terminal is coupled to the input, the ground terminal is coupled to the ground, the first terminal is coupled to the ground, and the second terminal is coupled to the input.

The invention also provides an ESD protection device, in which the ESD protection device is installed between a ground and an input connected with an inner circuit to be protected, thereby providing an ESD discharging path during the ESD event. The ESD protection device comprises a substrate of a first conductivity type; a plurality of first wells of a first conductivity type and a plurality of second wells of a second conductivity type; a plurality of first terminals having heavily doped impurity of the first conductivity type formed in the first wells; a second terminal having heavily doped impurity of the first conductivity type formed in the second well in a first region of the substrate; and a third terminal having heavily doped impurity of the second conductivity type formed in the second well in a second region of the substrate, wherein the first well and the second well are interleaved formed in the substrate, the first terminals are coupled to the ground, and the second terminal and the third terminal are coupled to the input.

BRIEF DESCRIPTION OF DRAWINGS

The present invention will be readily understood by the following detailed description in conjunction accompanying drawings, in which:

FIG. 6A is a schematic diagram of the ESD protection circuit of the second embodiment;

DETAILED DESCRIPTION OF THE PREFERRED EMBODIMENTS

To allow the Examiner to understand the technology, means and functions adopted in the present invention, reference is made to the following detailed description and attached drawings. The Examiner shall readily understand the invention deeply and concretely from the purpose, characteristics and specification of the present invention. Nevertheless, the present invention is not limited to the attached drawings and embodiments in following description.

The present invention illustrates an electrostatic discharge (ESD) protection device in high voltage and manufacturing method for the same. It relates to the ESD protection device with installation of at least one PNP transistor and at least one diode to protect an inner circuit receiving a high voltage, which is higher than 5V. The invention provides an ESD discharging path during the ESD event.

Figure 1:
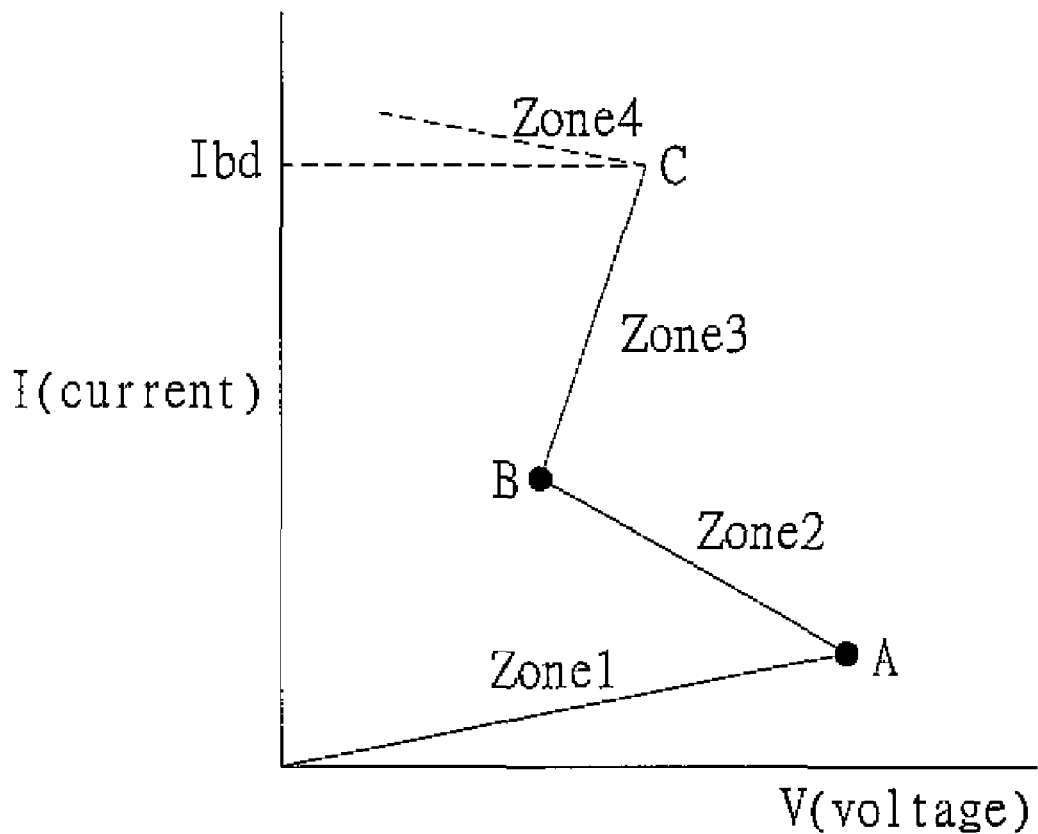
FIG. 1 is a voltage-current characteristic diagram of the ESD protection circuit of the prior art.
Figure 2:
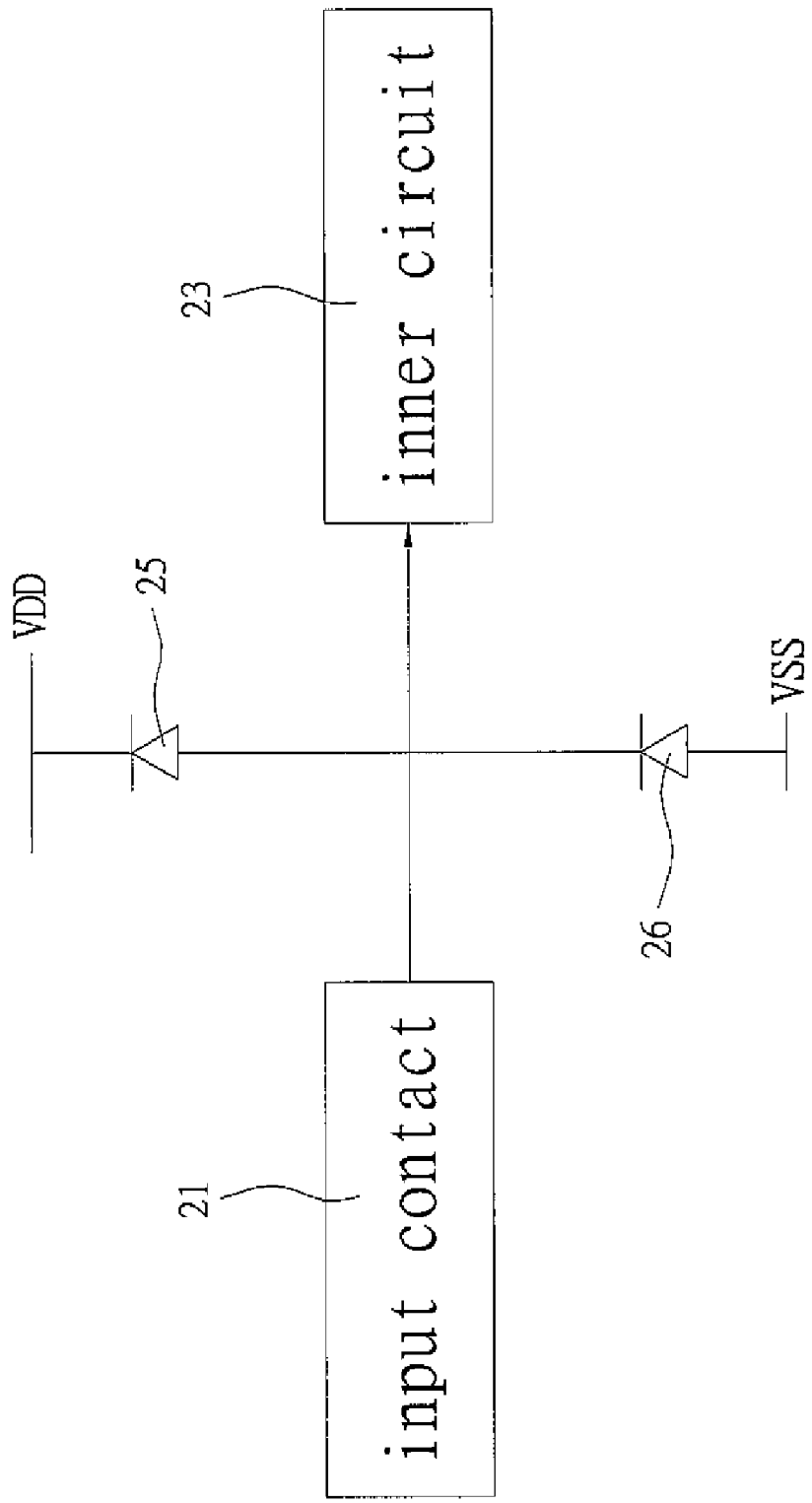
FIG. 2 is a schematic diagram of the ESD protection circuit with diode of the prior art.
Figure 3:
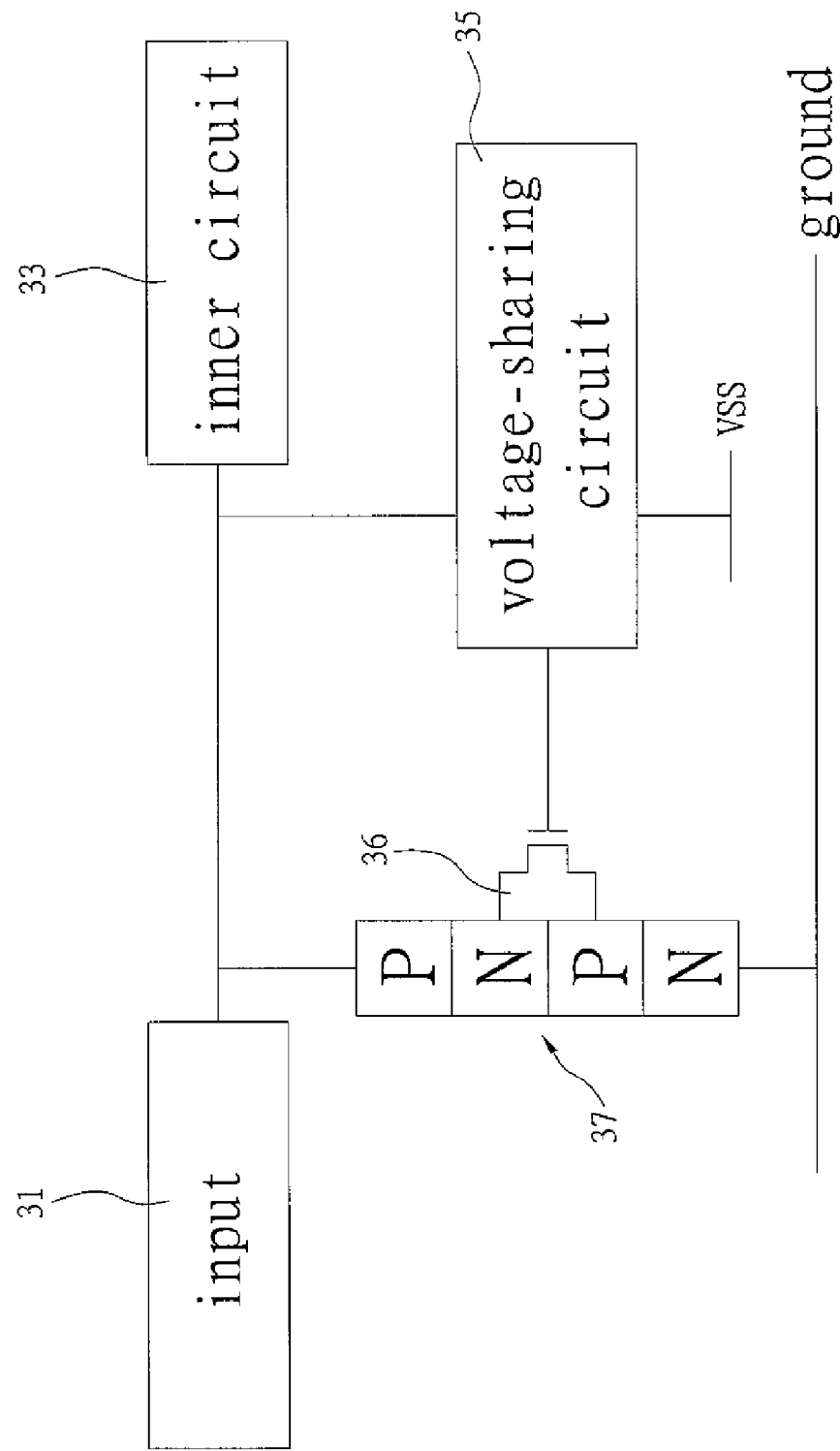
FIG. 3 is a schematic diagram of the ESD protection circuit with SCR elements and the voltage-sharing circuit of the prior art.
Figure 4:
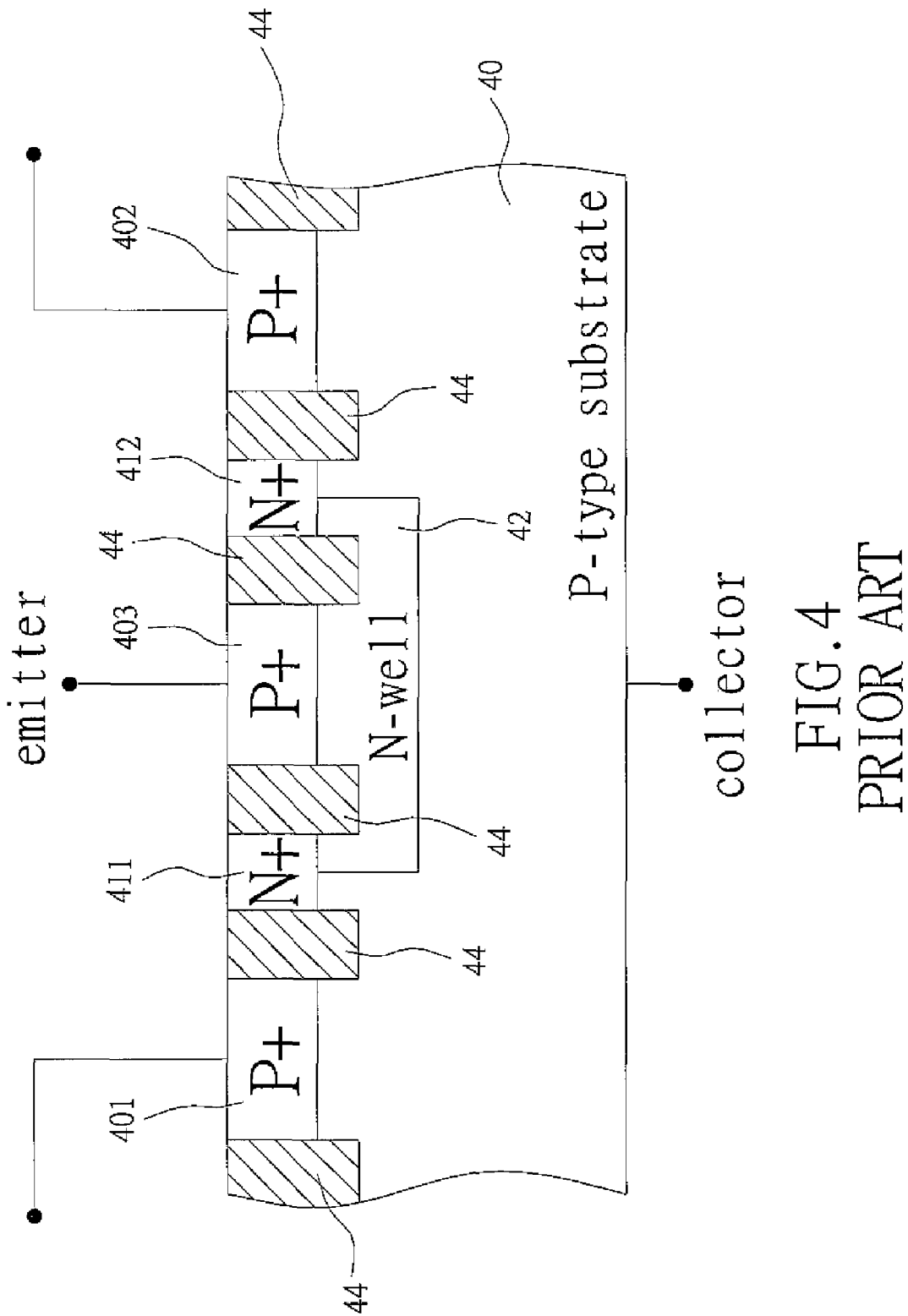
FIG. 4 is a schematic diagram of the ESD protection circuit with PNP transistor of the prior art.
Figure 5:
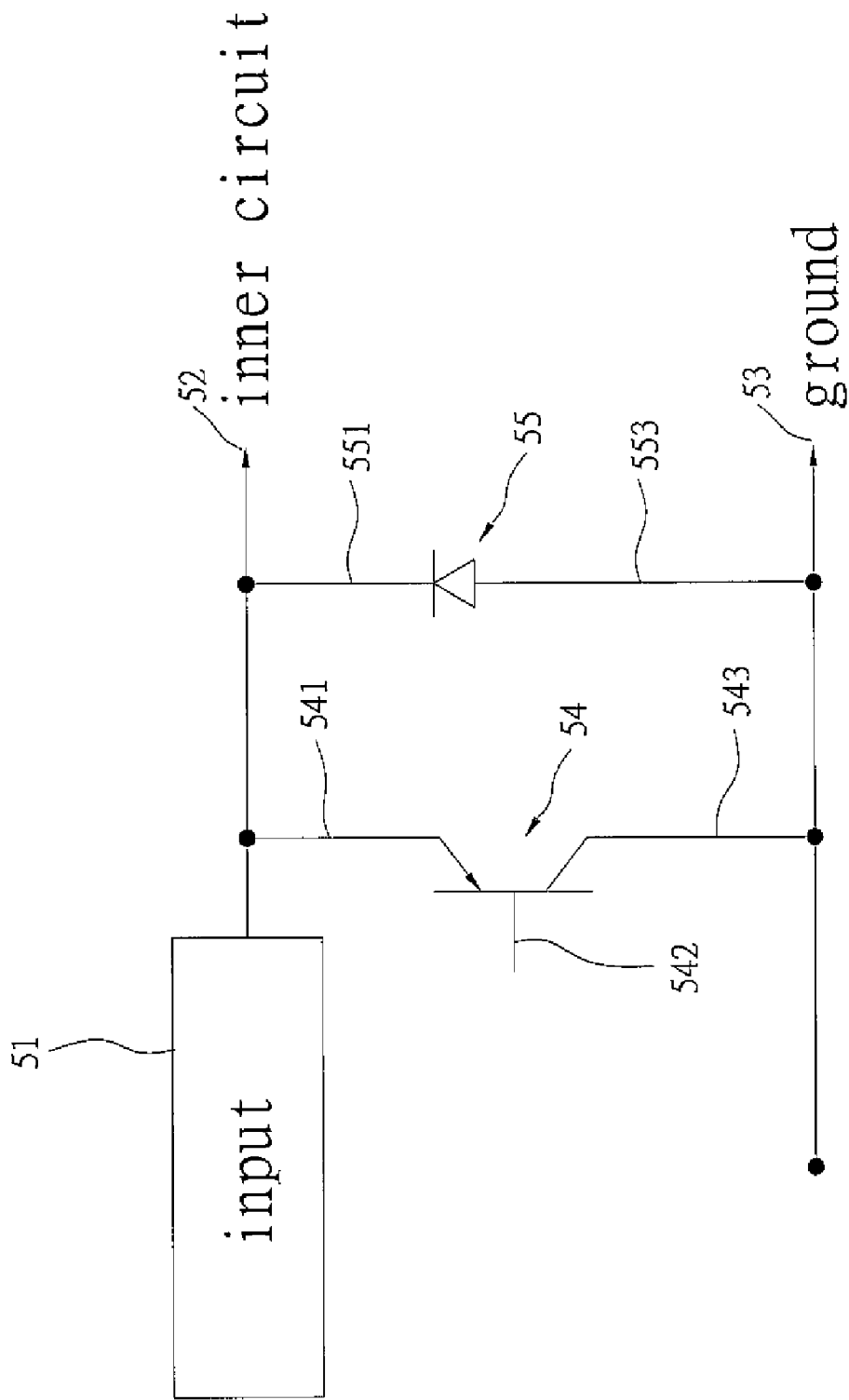
FIG. 5 is a schematic diagram of the ESD protection circuit of the first embodiment.

Reference is made to FIG. 5 showing a first embodiment of the present invention. For protecting the inner circuit 52, the embodiment provides a protection device comprising a PNP transistor 54 and a diode 55 electrically coupled in parallel. As the PNP transistor 54 shown in the diagram, an input terminal 541 (i.e. emitter of the transistor) and a ground terminal 543 (i.e. collector of the transistor) of the transistor 54 respectively couple with the input 51 and the ground 53. As the diode 55 shown in FIG. 5, a N terminal 551 and a P terminal 553 of the diode 55 respectively couple with the input 51 and the ground 53. In the first embodiment, the input 51 is electrically coupled with the inner circuit 52, wherein a Salicide block is disposed to prevent the region of diode 55 from salicide formation. As the ESD event occurs, the aforementioned device provides an ESD discharging path from the input 51 to the ground 53, and being used to protect the inner circuit 52 from the high voltage discharging. The PNP transistor 54 is composed of adjacent heavily doped P-type semiconductor zone (P+), lightly doped N-type semiconductor zone (N−), and the P-type semiconductor substrate (P-sub). The heavily doped P-type semiconductor zone (P+) forms the input terminal 541 of the PNP transistor 54, namely the emitter electrode of the transistor, which couples with the input 51 and the inner circuit 52. The lightly doped N-type semiconductor zone (N−) forms a N-type well, which is a control terminal 542, namely the base electrode, of the PNP transistor 54. The P-type semiconductor substrate forms the ground terminal 543, namely the collector electrode, of the PNP transistor 54, which couples with the ground 53.

Figure 6B:
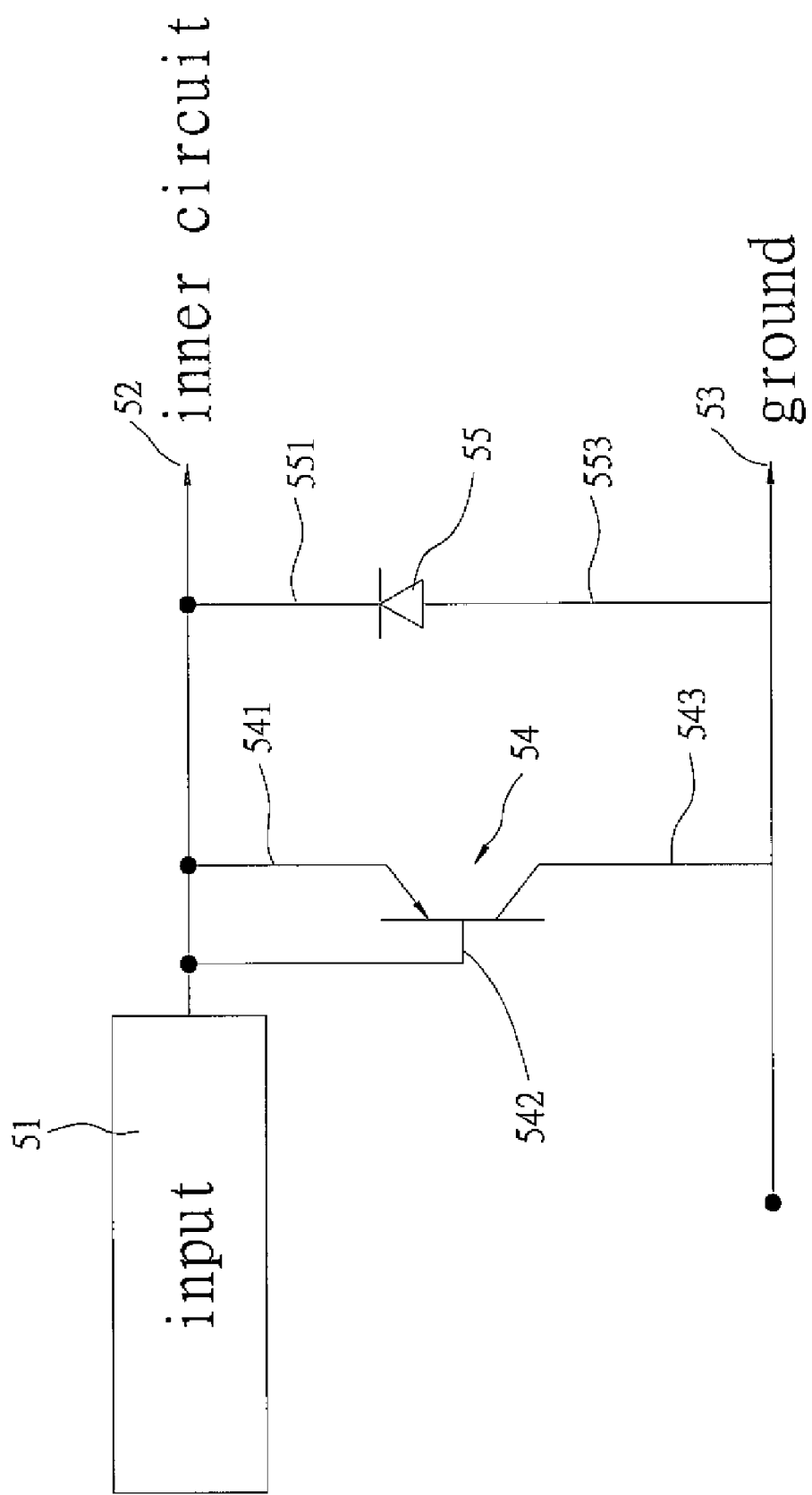
FIG. 6B is a schematic diagram of the ESD protection circuit of the third embodiment.

Particularly, the control terminal 542 of the PNP transistor 54 can be floating as the first embodiment shown in FIG. 5, and coupled with the ground 53 as the second embodiment shown in FIG. 6A, and coupled with the input 51 as the third embodiment shown in FIG. 6B.

As the first embodiment illustrated in FIG. 5, the diode 55 is formed with adjacent N-type well and P-type well. The N-type well within is the lightly doped N-type semiconductor zone (N−) having an N terminal 551 of the diode coupled with input 51. The P-type well nearby is the lightly doped P-type semiconductor zone (P−) having a P terminal 553 of the diode coupled with ground 53.

More particularly, the area of the diode is larger than the area of the PNP transistor is the preferred embodiment of the present invention.

The result of the experiment data listed in table 1 shows the ESD protection device of the present can reach the purpose of high-voltage ESD protection, however, the data is not limitation or any constraint of the present invention.

TABLE 1

| type of ESD protection device | Human body mode (HBM) | machine mode (MM) |
| --- | --- | --- |
| Diode only | 3000 | 200 |
| PNP transistor only | 2000 | 200 |
| PNP transistor electrically coupled with Diode in parallel | 4500 | 300 |

Figure 6C:
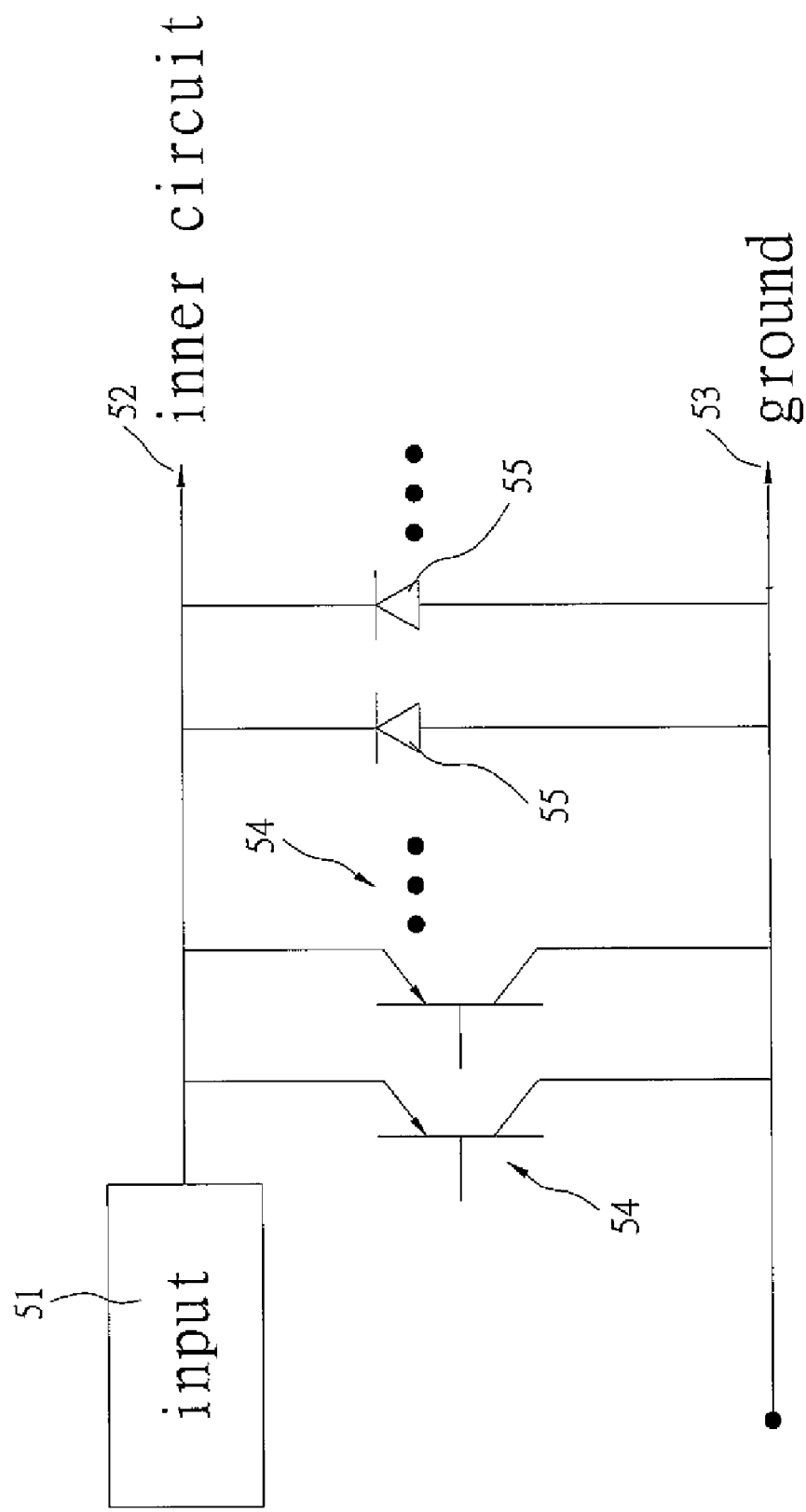
FIG. 6C is a schematic diagram of the ESD protection circuit of the fourth embodiment.

FIG. 6C shows the fourth embodiment of the present invention, which illustrates a plurality of PNP transistors 54 and a plurality of diodes 55 electrically coupled with each other in parallel. Whereby the ESD protection device can enhance the capability of high voltage ESD protection further.

Figure 7:
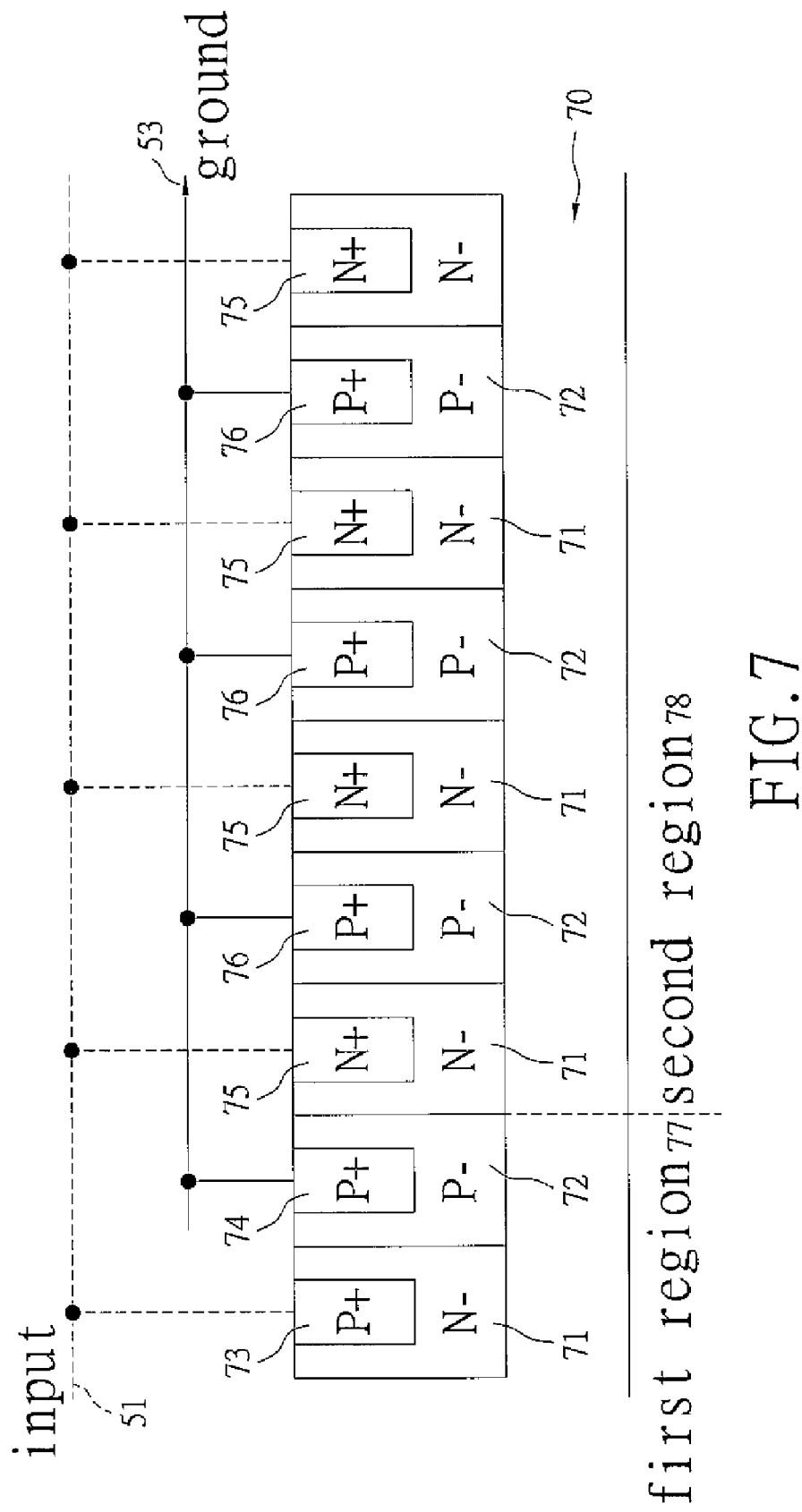
FIG. 7 illustrates a cross-sectional diagram of the ESD protection circuit of the present invention.

FIG. 7 shows the cross-sectional diagram of the present invention. A plurality of lightly doped N-type semiconductor zones (N−) 71 and lightly doped P-type semiconductor zone (P−) 72 are doped on the P-type substrate 70 contiguously. By far, the N− zone 71 has formed N-type well, and P− zone 72 has formed P-type well. After that, the device is separated into a first region 77 and a second region 78 according the following implementation.

In the first region 77 as shown in FIG. 7, a heavily concentration P-type semiconductor material is doped on one of the N− zone 71 to form a first P+ zone 73, and a heavily concentration P-type semiconductor material is doped on one of the P− zone 72 next to the aforementioned N− zone 71 to form a second P+ zone 74. So the first region 77 has formed the PNP transistor, which includes the first P+ zone 73, the second P+ zone 74, and the relevant N− zone 71 and P− zone 72 formed on the P-type substrate 70, wherein the first P+ zone 73 is the emitter electrode, the N− zone 71 is the base electrode and the P-type substrate 70 is the collector electrode of the PNP transistor, respectively. The second P+ zone 74, and the relevant P− zone 72 are the pickup of the P-type substrate 70 for reducing the contact resistance. The first P+ zone 73 couples with the input 51, and the P-type substrate 70 couples with the ground 53 through the P− zone 72 and the second P+ zone 74.

Figure 8:
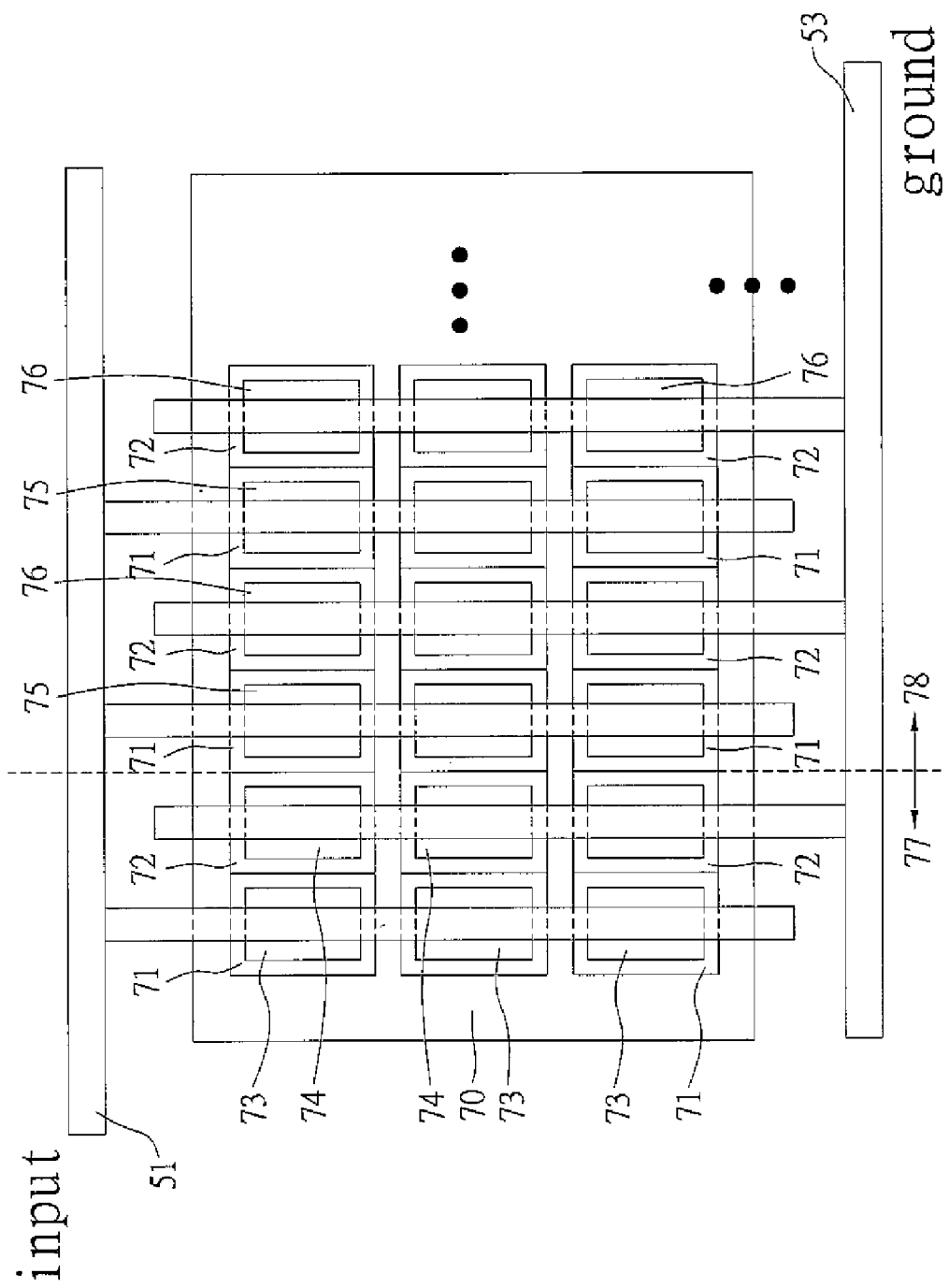
FIG. 8 illustrates a layout diagram of the ESD protection circuit of the present invention.

The second region 78 includes the other N− zone 71 and P− zone 72 doped on the P-type substrate 70 contiguously, and N+ zone 75, P+ zone 76 doped within each N− zone 71 and P− zone 72 respectively. Wherein the heavily concentration N-type semiconductor material is doped on the N− zone 71 to form the N+ zone 75, and the heavily concentration P-type semiconductor material is doped on the P− zone 72 to form the P+ zone 76 in the second region 78 respectively for reducing the contact resistance. The adjacent N− zone 71 and P− zone 72 in the second region 78 is to form the diode of the present invention. For enhancing the capability of ESD protection, the diode with adjacent N-type well and P-type well should be blocked to prevent from the salicide formation. In the second region 78, the N− zone 71 is electrically coupled to the input 51 through N+ zone 75, and the P− zone 72 is electrically coupled to the ground 53 through the P+ zone 76. FIG. 8 shows the layout diagram of a preferred embodiment of the present invention. The ESD device shown in diagram is a vertical structure between the input 51 and the ground 53. A plurality of contiguous and adjacent N− zones 71 and P− zones 72 are formed with doping the lightly concentration N-type and P-type semiconductor material on the P-type substrate respectively, namely, the N− zones 71 form the N-type wells, and P− zones 72 form the P-type well. The ESD device is separated into the first region 77 and the second region 78.

In FIG. 8, a plurality first P+ zones 73 are formed with the heavily concentration P-type semiconductor material doped on the N− zones 71 in the first region 77, and connect with the input 51. A plurality of second P+ zones 74 are formed with the heavily concentration P-type semiconductor material doped on the P− zones 72 in the second region 78, and connect with the ground 53.

Moreover, a plurality N+ zones 75 are formed in second region 78 with the heavily concentration N-type semiconductor material doped on the N− zones 71 (N-type well). A plurality of P+ zones 76 in the second region 78 are formed with the heavily concentration P-type semiconductor material doped on the P− zones 72 (P-type well). As shown in FIG. 8, the N+ zones 75 in vertical direction connect with the input 51, and the P+ zones 76 in the vertical direction connect with the ground 53.

Figure 9:
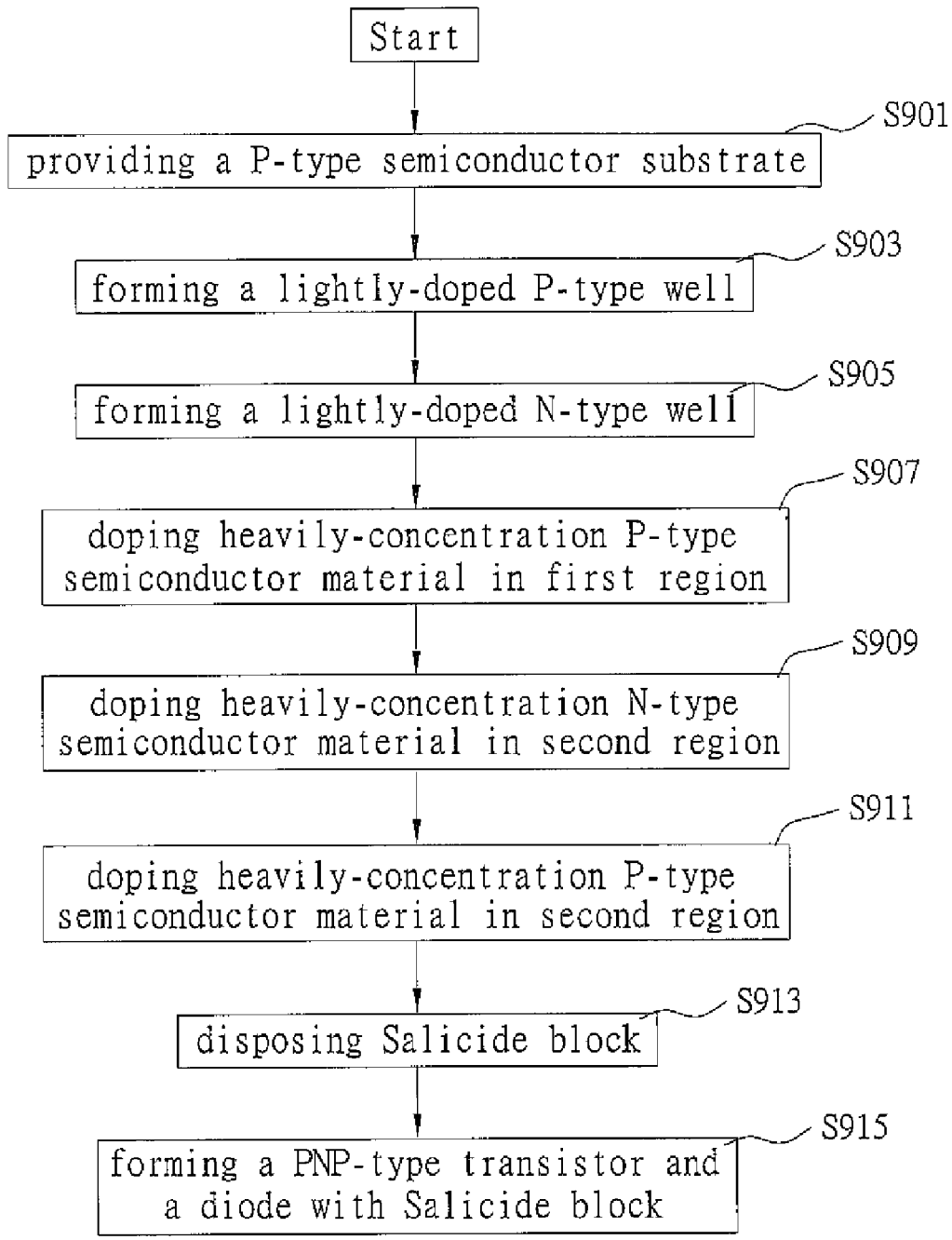
FIG. 9 is a flow chart of the manufacturing method of the present invention.

Reference is made to FIG. 9 showing the flow chart of the manufacturing method of the present invention. The method for manufacturing an ESD protection device including at least one PNP transistor and at least one diode are coupled between the ground and the input of the device, comprising the steps:

First, a P-type semiconductor substrate (P-sub) is provided. (step S901)

In step S903, a lightly doped P-type well is formed. In the preferred embodiment, P-type ions are implanted to the P-type semiconductor substrate, and diffused to form at least one lightly doped P-type well.

Next, the neighboring lightly doped N-type well is formed adjacent to the P-type well as well. Where N-type ions are implanted to the P-type semiconductor substrate and diffused to form at least one lightly doped. (step S905)

The aforementioned N-type well and P-type well are formed NPNP structure above the P-type substrate contiguously.

The whole ESD device is separated into the first region and the second region as required. One or a plurality of heavily doped P-type semiconductor zones (P+ zone) in the first region are formed on the N-type well and P-type well of the first region by doping the heavily concentration P-type semiconductor material (P+ zone in first region). (step S907)

One or a plurality of heavily doped N-type semiconductor zones N+ zone) coupled with the input are formed on the N-type well of the second region by doping the heavily concentration N-type semiconductor material (N+ zone in second region). (step S909)

Meantime, in the step S911, one or a plurality of heavily doped P-type semiconductor zones (P+ zone) coupled with the ground are formed on the P-type well of the second region by doping the heavily concentration P-type semiconductor material (P+ zone in second region).

As illustrated above, the N-type well in second region having an N terminal of the diode coupled with the input of the ESD protection device. The P-type well nearby having a P terminal of the diode coupled with the ground of the device.

After forming the N+ zone and the P+ zone on the second region, one or a plurality of the Salicide blocks (SAB) are disposed over the regions among the N-type well and the P-type well contiguously. (step S913)

The structure in the first region is the PNP transistor, and diode with Salicide block is formed in the second region as well. (step S915)

Where the PNP transistor is composed of the P-type semiconductor zone, the N-type well and P-type semiconductor substrate in the first region, and the diode is composed of the P-type well and the N-type well of the adjacent second region. Particularly, the base electrode of the PNP transistor is floating, or couples with the ground, or couples with the input. The emitter electrode and collector electrode of the transistor couple with the input and the ground respectively, and the diode bridges the input and the ground using the two terminals thereof.

Finally, the combination of the PNP transistors and the diodes is employed to provide an ESD path to protect the inner circuit from high voltage electro-static discharge (ESD).

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein

What is claimed is:

1. An ESD protection device protecting an inner circuit from an electrostatic discharge by providing an ESD path from an input to a ground, the ESD protection device comprises:
   a substrate of a first conductive type;
   a transistor formed in the substrate having an input terminal of the first conductive type, a control terminal of a second conductive type, and a ground terminal of the first conductive type, wherein the input terminal directly connects to the input, the control terminal directly connects to the input or the ground, and the ground terminal directly connects to the ground; and
   a diode formed in the substrate having a first terminal of the first conductive type and a second terminal of the second conductive type, wherein the first terminal directly connects to the ground and the second terminal directly connects to the input.

2. The ESD protection device as recited in claim 1, wherein the control terminal comprises a lightly doped first well of the second conductive type, and the input terminal comprises a heavily doped second well of the first conductive type.

3. The ESD protection device as recited in claim 1, wherein the ground terminal comprises a lightly doped third well of the first conductive type and a heavily doped fourth well of the first conductive type.

4. The ESD protection device as recited in claim 1, wherein the second terminal comprises a lightly doped fifth well of the second conductive type and a heavily doped sixth well of the second conductive type.

5. The ESD protection device as recited in claim 1, wherein the first terminal comprises a lightly doped seventh well of the first conductive type and a heavily doped eighth well of the first conductive type.

6. The ESD protection device as recited in claim 1, wherein an area density of the diode is larger than that of the transistor.

7. An ESD protection device protecting an inner circuit from an electrostatic discharge by providing an ESD path from an input to a ground, the ESD protection device comprises:
   a substrate of a first conductive type;
   a transistor formed in the substrate having an input terminal of the first conductive type, a control terminal of a second conductive type, and a ground terminal of the first conductive type, wherein the input terminal directly connects to the input, the control terminal is floating, and the ground terminal directly connects to the ground; and
   a diode formed in the substrate having a first terminal of the first conductive type and a second terminal of the second conductive type, wherein the first terminal directly connects to the ground and the second terminal directly connects to the input.

8. An ESD protection device protecting an inner circuit from an electrostatic discharge by providing an ESD path from an input to a ground, the ESD protection device comprises:
   a substrate of a first conductivity type;
   a plurality of lightly doped first wells of a first conductivity type and a plurality of lightly doped second wells of a second conductivity type, wherein the first well and the second well are interleaved formed in the substrate;
   a plurality of first terminals having heavily doped impurity of the first conductivity type formed in the first wells;
   a second terminal having heavily doped impurity of the first conductivity type formed in the second well in a first region of the substrate; and
   a third terminal having heavily doped impurity of the second conductivity type formed in the second well in a second region of the substrate;
   wherein the first terminals are coupled to the ground, the second terminal and the third terminal are coupled to the input, and the second well in the first region is floating or directly connects to the ground or the input.

9. The ESD protection device as recited in claim 8, wherein in the first region, the second terminal, the first well and the second well are arranged to act as a transistor.

10. The ESD protection device as recited in claim 9, wherein in the second region, the first well and the second well are arranged to act as a diode.

11. The ESD protection device as recited in claim 10, wherein an area density of the diode is larger than that of the transistor.

* * * * *